United States Patent [19]

Metz

[11] Patent Number: 4,797,572
[45] Date of Patent: Jan. 10, 1989

[54] TRIGGER RE-SYNCHRONIZATION CIRCUIT

[75] Inventor: Arthur J. Metz, Gervais, Oreg.

[73] Assignee: Tektronix, Inc., Beaverton, Oreg.

[21] Appl. No.: 6,816

[22] Filed: Jan. 21, 1987

[51] Int. Cl.⁴ .................. H03K 5/13; H03K 17/00; H03K 5/159; H03K 4/08
[52] U.S. Cl. .................. 307/269; 307/228; 307/602; 328/72; 328/74; 328/55; 328/60; 328/63
[58] Field of Search .................. 328/55, 56, 60, 63, 328/59, 72, 74; 307/260, 269, 602, 228

[56] References Cited

U.S. PATENT DOCUMENTS

| | | | |
|---|---|---|---|
| 3,676,707 | 7/1972 | Conrad et al. | 307/228 |
| 3,699,458 | 10/1972 | Martin et al. | 307/286 |
| 3,725,792 | 4/1973 | Kellogg | 328/60 |
| 3,947,697 | 3/1976 | Archer et al. | 307/269 |
| 4,583,008 | 4/1986 | Grugett | 328/55 |

Primary Examiner—John S. Heyman
Assistant Examiner—Trong Quang Phan
Attorney, Agent, or Firm—John P. Dellett; Peter J. Meza

[57] ABSTRACT

A trigger re-synchronization circuit providing reduced trigger gate jitter for use in a high speed display device such as an oscilloscope or digitizer. The trigger re-synchronization circuit is cascadable.

37 Claims, 3 Drawing Sheets (PROPOSED CHANGE)

FIG. 2
(PROPOSED CHANGE)

TRIGGER RE-SYNCHRONIZATION CIRCUIT

BACKGROUND OF THE INVENTION

This invention relates to inhibitable trigger circuits and particularly to oscilloscope trigger circuits inhibited during a holdoff state.

Devices making use of a trigger signal to initiate a function or activity typically inhibit generation of the trigger signal during the function or activity and for a time afterward, thereby allowing a recovery period between each triggered function or activity and receipt of the next trigger signal.

In a device such as an oscilloscope or digitizer, a display sweep is initiated by a trigger signal presented to a sweep generator. Following the display sweep, a recovery period, known as the holdoff period, is required to allow time for the electron beam to return to the left side of the display screen, i.e., to retrace, and to allow time for the sweep generator to stabilize and prepare for the next display sweep. Following the holdoff period, the oscilloscope is ready for the next display sweep.

The trigger signal is typically generated using an input signal from a predetermined trigger source. The trigger source signal may be internal or external to the oscilloscope; it is typically periodic and often bears some synchronous relation to the signal to be displayed. The trigger source signal is, in any case, a stream of potential trigger points, each a proper candidate for initiating a trigger signal.

The trigger circuit has two fundamental inputs, a trigger source signal and a holdoff signal, and one fundamental output, the trigger signal. The trigger circuit must make a decision to either accept a trigger source signal event or reject the same and wait for the next trigger source signal event. During the display sweep and subsequent holdoff period all trigger source signal events are ignored by the trigger circuit and no trigger signal is generated; after the holdoff period, the next trigger source event presented to the trigger circuit is accepted and the trigger circuit generates a trigger signal.

It is desirable to generate trigger signals bearing a consistent relationship to the selected trigger source event. A consistent relationship is maintained when a trigger source event is presented to a trigger gate at a time when the enabling signal is clearly in the enabling state. This situation is called "early holdoff" because the enabling signal precedes the trigger source event. The resulting trigger signal is a direct result of the presentation of the trigger source event to the trigger gate and, accordingly, bears a consistent relationship to the selected trigger source event.

Interference between the enabling signal and a trigger source event may produce a trigger signal departing from the aforementioned consistent relationship. Presentation of an enabling signal to the trigger gate during presentation of a trigger source event, termed "late holdoff", may corrupt the trigger-source/trigger-signal relationship. It may be said that, in the case of late holdoff, the resulting trigger signal is caused more by the advent of the enabling signal than by the occurrence of the trigger source signal event; such a trigger signal does not bear a consistent relationship to the trigger source signal.

The term "jitter" refers to the horizontal displacement of the waveform portrayed on an oscilloscope display caused by the inaccurate or inconsistent timing of the trigger signal in relation to the selected trigger source signal event. Existing trigger circuits suffer from excess jitter caused by the interaction of the trigger source signal event and the inhibition, or holdoff, signal. The present invention serves to greatly reduce jitter caused by interaction between the trigger source signal and the inhibition signal, without limiting the trigger bandwidth.

SUMMARY OF THE INVENTION

In accordance with the present invention, a cascadable trigger re-synchronization circuit is characterized by reduced trigger gate jitter. Each stage of the trigger re-synchronization circuit comprises a trigger source signal delay path and a trigger gating means. In a given stage, the trigger gating means is responsive to a trigger signal generated in the previous stage and responsive to the selected trigger source event utilized in the previous stage in delayed form via the trigger source delay path. The present invention provides means for insuring that at a given trigger gate presentation of the selected trigger source event follows presentation of the trigger signal generated in the previous stage, thereby improving the probability of early holdoff for that trigger gate. The initial stage may operate according to conventional triggering methods wherein the trigger signal produced is susceptible to jitter. Subsequent stages, implemented in accordance with the present invention, provide additional trigger gates each having less probable trigger jitter than the trigger gate of the previous stage. Total propagation through the trigger circuit is increased with each additional stage; however, triggering frequency bandwidth is not diminished.

It is accordingly an object of the present invention to provide an improved trigger circuit less susceptible to trigger jitter than prior trigger circuits.

It is a further object of the present invention to provide an improvement on a prior art trigger circuit which may be used in realtime oscilloscopes employing Microchannel plates and in high speed digitizing oscilloscopes.

The subject matter of the present invention is particularly pointed out and distinctly claimed in the concluding portion of this specification. However, both the organization and method of operation of the invention, together with further advantages and objects thereof, may be best understood by reference to the following description taken in conjunction with the accompanying drawings wherein like reference characters refer to like elements.

DETAILED DESCRIPTION

The circuitry disclosed herein is described as including a plurality of separate logic components merely for the purpose of facilitating explanation, and it will be understood actual circuitry can comprise one or more suitably connected integrated circuits having more, or fewer, circuit elements for carrying out the same functions.

Figures 1, 3, 6:
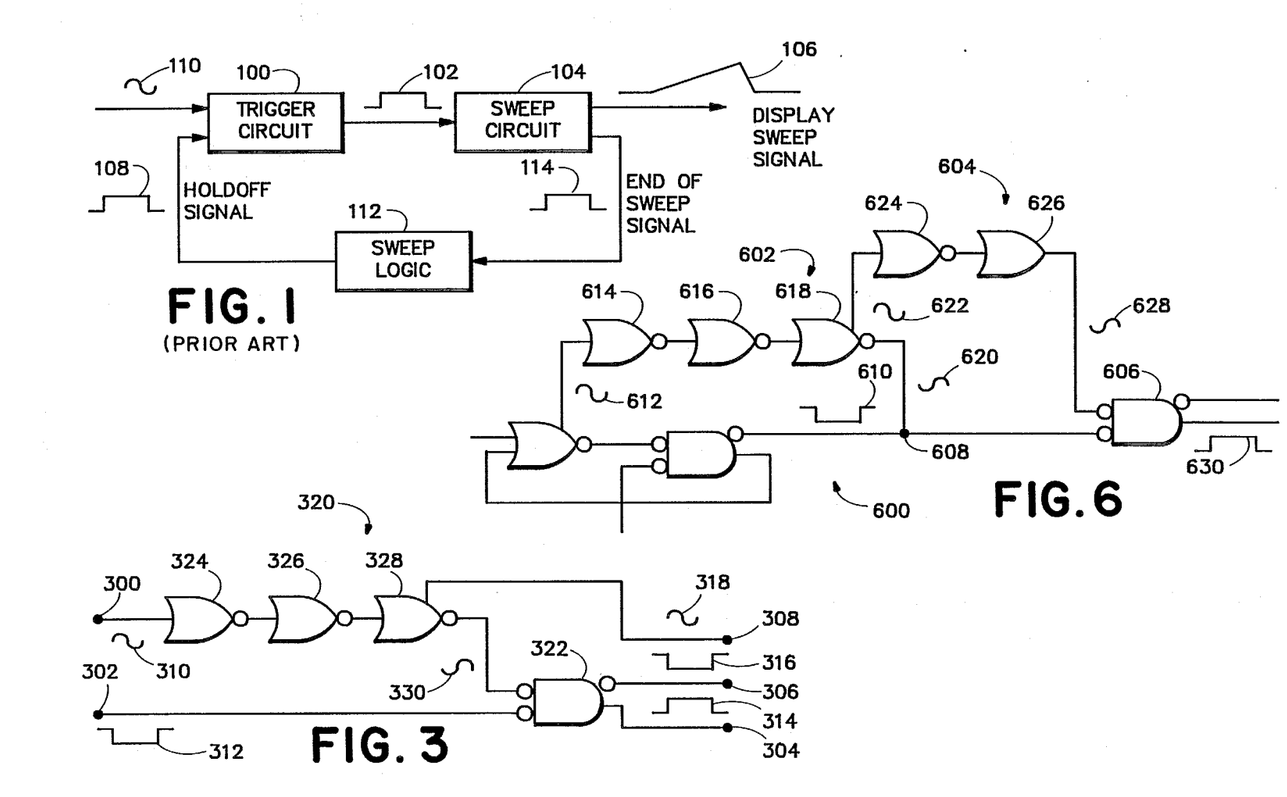
FIG. 1 is a simplified block diagram showing the location of a trigger circuit in a typical oscilloscope horizontal system.
FIG. 3 is a circuit diagram of a single resynchronization stage presented to illustrate the method of cascading re-synchronization stages.
FIG. 6 illustrates an alternative embodiment of the present invention which makes use of a WIRED OR function to reduce the number of gates needed, power consumption, and total propagation delay.

FIG. 1 is a simplified block diagram showing the location of a trigger circuit 100 in a typical oscilloscope horizontal system. The trigger circuit 100 is responsible for producing a trigger signal 102 utilized by a sweep circuit 104 to initiate generation of a display sweep signal 106. The trigger circuit 100 is inhibited by a holdoff signal 108 and receives the trigger source signal 110 to time generation of the trigger signal 102. A sweep logic circuit 112 provides the holdoff signal 108 to the trigger circuit 100. Upon detection of an end of display sweep signal 114 from the sweep circuit 104, the sweep logic circuit 112 waits until the end of the the requisite holdoff period and then changes the holdoff signal 108 from a holdoff state to a non-holdoff, or enabling, state.

The trigger source signal 110 may be thought of as including a series of trigger source events bearing a synchronous relation to a signal to be displayed on the oscilloscope. By utilizing these trigger source events to initiate a display sweep, each sweep displays the same portion of the cycle of the signal. For example, if the trigger event is synchronous with the beginning of each cycle in the signal, a display sweep suitably begins with the beginning of a cycle. Successive displays each begin at the same point in the signal and appear identical on the screen; a stable image of the signal is thereby presented. If the trigger circuit fails to maintain a consistent relationship between the selected trigger source event and the trigger signal, the resulting display sweep begins at a point in the cycle other than the desired point, and the resulting display sweep appears as an aberration on the oscilloscope screen.

Figure 2:
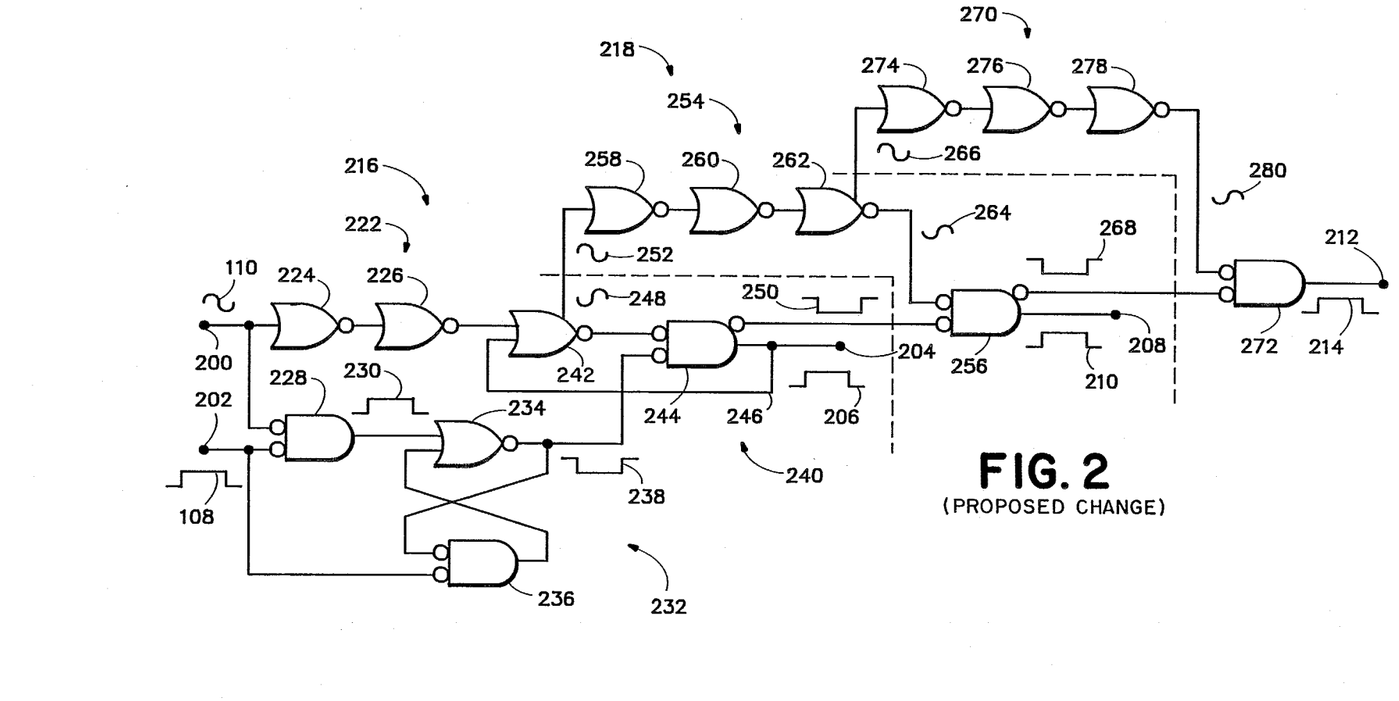
FIG. 2 is a circuit diagram of a trigger circuit utilizing a two stage embodiment of the present invention.

FIG. 2 is a circuit diagram of a specific embodiment of the present invention utilized in a trigger circuit suitable to function as the trigger circuit 100 in FIG. 1. The trigger source signal 110 is received at a first input terminal 200, and the holdoff signal 108 is received at a second input terminal 202. The trigger signal 102 (FIG. 1) may be taken from one of three alternative output terminals, a first output terminal 204 providing a first trigger signal 206, a second output terminal 208 providing a second trigger signal 210, or a third output terminal 212 providing a third trigger signal 214. The second output terminal 208 and the third output terminal 212 present trigger signals generated in accordance with the present invention.

The trigger circuit of FIG. 2 may be generally divided into three parts: a prior art trigger circuit 216 which receives the trigger source signal 110 and the holdoff signal 108 and which generates the first trigger signal 206; a first resynchronization stage 218 which provides the second trigger signal 210; and a second re-synchronization stage 220 which provides the third trigger signal 214.

The prior art trigger circuit 216 may be divided into four parts. The first portion of the prior art trigger circuit is an input stage trigger source signal delay path 222 comprised of serially linked single input NOR gates 224 and 226. The input stage trigger source signal delay path 222 receives the trigger source signal 110 from the first input terminal 200 coupled to NOR gate 224 and provides the trigger source signal in delayed form at the output of NOR gate 226.

The second portion of the prior art trigger circuit 216 is an input stage coincidence detector 228 comprised of an inverted input AND gate having a first inverted input coupled to the first input terminal 200 and a second inverted input coupled to the second input terminal 202. The input stage coincident detector 228 is responsive to the coincidence of a triggering event in the trigger source signal 110 and the enabling state of the holdoff signal 108, and provides at its output a coincidence detector output 230.

The third portion of the prior art trigger circuit is an arm latching means 232 comprised of a NOR gate 234 and an inverted input AND gate 236. A first input of NOR gate 234 accepts the coincidence detector output 230, while a second input of NOR gate 234 accepts the output of inverted input AND gate 236. A first input of the inverted input AND gate 236 receives the output of NOR gate 234, while a second input of the inverted input AND gate 236 receives the holdoff signal 108 from the second input terminal 202. The arm latching means 232 acts as a bistable device with the output from NOR gate 234 providing an arm signal 238 representative of the state of the bistable arm latching means 232.

The fourth portion of the prior art trigger circuit 216 is a primary trigger latching means 240 including trigger source signal gating means 242, a first trigger gating means 244, and a feedback means 246. The first trigger gating means 244 is an inverted input AND gate having a non-inverted output, an inverted output, a first inverted input coupled to receive the arm signal 238, and a second inverted input coupled to receive a first delayed trigger source signal 248. The first trigger gating means 244 provides at its non-inverted output the first trigger signal 206 for the first output terminal 204 and also supplies at its inverted output an inverted first trigger signal 250. The trigger source signal gating means 242 is a NOR gate having a non-inverted output, an inverted output, a first input coupled to receive the trigger source signal 110 in delayed form via the input stage trigger source delay path 222, and a second input coupled to receive the first trigger signal 206 via feedback means 246. The trigger source signal gating means 242 normally provides at its inverted output the inverted first delayed trigger source signal 248 and at its non-inverted output a first delayed trigger source signal 252.

The prior art trigger circuit 216 operates in the following manner. The input stage coincidence detector 228 monitors the first input terminal 200 for a triggering event in the trigger source signal 110 and also monitors the second input terminal 202 for an enabling state of the holdoff signal 108. When both an enabling state of the holdoff signal 108 and a triggering event in the trigger source signal 110 are presented to the input stage coincidence detector 228, the input stage coincidence detector 228 responds by changing the coincidence detector output 230 from a first non-enabling state to a second enabling state. The enabling state of the coincidence detector output 230 causes the arm latching means 232 to change from a first state wherein the arm signal 238 is in a non-enabling condition to a second state wherein the arm signal 238 state is in an enabling condition. During operation of the arm latching means 232, the trigger source signal event associated with the change in state of the coincidence detector, i.e., the selected trigger source signal 110 event, is coupled through the input stage trigger source signal delay path 22, through the trigger source signal gating means 242, and arrives at the first trigger gating means 244 in the form of the inverted first delayed trigger source signal 248. When both the enabling state of the arm signal 238 and the selected trigger source event reach the first trigger gating means 244, the primary trigger latching means 240 changes from a first state wherein the first trigger signal 206 is in a non-triggering state to a second state wherein the first trigger signal 206 is in a triggering state. The primary trigger latching means 240 is maintained in the triggering state by virtue of the feedback means 246 which presents the first trigger signal 206 to the trigger source signal gating means 242. In response to the triggering state of the first trigger signal 206, the trigger source signal gating means 242 terminates propagation of the first delayed trigger source signal 248 and presents a constant signal to the first trigger gating means 244. The primary trigger latching means remains in the triggering state for as long as an enabling state of the arm signal 238 is presented to the first trigger gating means 244.

Ideally, the enabling state of the arm signal 238 reaches the first trigger gating means before arrival of the selected trigger source event associated with the latching of the primary trigger latching means 240. To this end, the input stage trigger source signal delay path 222 allows time for the arm latching means 232 to latch. Increasing the delay in the input stage trigger source signal delay path 222 is desirable to eliminate jitter due to metastability in the arm latching means 232; however, if excessive gate delay is used, triggering on the wrong edge of the preceding signal may be possible.

First re-synchronization stage 218 includes a first trigger source signal delay path 254 and a second trigger gating means 256. The first trigger source signal delay path 254 is comprised of serially linked signal input NOR gates 258, 260, and 262. NOR gate 262 is the last NOR gate in the chain and has a non-inverted output and an inverted output. The first trigger source signal delay path 254 receives the first delayed trigger source signal 252 at the input to NOR gate 258, and provides both an inverted second delayed trigger source signal 264 at the inverted output of NOR gate 262 and a second delayed trigger source signal 266 at the non-inverted output of NOR gate 262. The second trigger gating means 256 is an inverted input AND gate having a non-inverted output, an inverted output, a first inverted input which receives the inverted first trigger signal 250, and a second inverted input which receives the inverted second delayed trigger source signal 264. The second trigger gating means 256 provides at its non-inverted output the second trigger signal 210 for the second output terminal 208 and also provides at its inverted output an inverted second trigger signal 268.

The first re-synchronization stage 218 operates in the following manner. When the primary trigger latching means 240 changes from a non-triggering state to a triggering state, the second trigger gating means 256 is enabled by the inverted first trigger signal 250. Presentation of the enabling state of the inverted first trigger signal 250 to the second trigger gating means 256 should precede presentation of the selected trigger source signal event to the second trigger gating means 256, because the selected trigger source event must travel through the first trigger source signal delay path 254, whereas the enabling state of the inverted first trigger signal appears immediately at the input to the second trigger gating means. Thus, the probability of early holdoff is improved for the second trigger gating means 256.

Even if the delay provided by the first trigger source signal delay path 254 is insufficient to allow the enabling state of the inverted first trigger signal 250 to precede the selected trigger source signal event at the second trigger gating means 256, the first re-synchronization stage 218 at least reduces the time difference between the enabling state of the inverted first trigger signal 250 and the selected trigger source signal event, i.e., the first re-synchronization stage allows the enabling state of the inverted first trigger signal 250 to at least catch-up with, if not precede, the selected trigger source signal.

Second re-synchronization stage 220 includes a second trigger source signal delay path 270 and a third trigger gating means 272. The second trigger source signal delay path 270 is comprised of serially linked signal input NOR gates 274, 276, and 278. The second trigger source signal delay path 270 receives the second delayed trigger source signal 266 at the input to NOR gate 274, and provides an inverted third delayed trigger source signal 280 at the output of the last gate in the chain, NOR gate 278. The third trigger gating means 272 is an inverted input AND gate with a first inverted input coupled to receive the inverted second trigger signal 268 and with a second inverted input coupled to receive the inverted third delayed trigger source signal 280. The third trigger gating means provides at its output the third trigger signal 214 coupled to the third output terminal 212.

The second re-synchronization stage 220 operates in a manner similar to the first resynchronization stage 218. When the second trigger gating means 256 changes from a non-triggering state to a triggering state, the third trigger gating means 272 is enabled by the inverted second trigger signal 268. Presentation of the enabling state of the inverted second trigger signal 268 to the third trigger gating means 272 should precede presentation of the selected trigger source signal event to the third trigger gating means 272, because the selected trigger source event must travel through the second trigger source signal delay path 270, whereas the enabling state of the inverted second trigger signal 268 appears immediately at the input to the third trigger gating means 272. Thus, the probability of early holdoff is further improved for the third trigger gating means 272.

In the event that the delay provided by trigger source signal delay path 254 is insufficient to allow the enabling state of the inverted first trigger signal 250 to precede the selected trigger source signal event at the second trigger gating means 256, the second re-synchronization stage 220 allows the enabling state of the inverted second trigger signal 268 to catch-up with, and most likely precede, the selected trigger source signal. Additional stages may be added in the event of jitter at the output of the third trigger gating means 272.

The first re-synchronization stage 218 and the second re-synchronization stage 220 each give the trigger circuit two more gate delays of settling time. If more than two gate delays are added, the upper triggering frequency will be limited because, in the case of the first re-synchronization stage 218, when the input period becomes very short, the latched signal from the first trigger gating means 244 will overlap the previous signal from the first trigger source signal delay path 254 and cause a spike at the output of the second trigger gating means 256. Similar reasoning applies to the case of the second synchronization stage 220. In either case, at most one trigger source signal event exists in either the first trigger source signal delay path 254 or the second trigger source signal delay path 270.

Considering overall operation, at a time just before the end of the holdoff period, the arm latching means 232 presents a non-enabling arm signal 238 to the primary trigger latching means 240 and thereby maintains the primary trigger latching means 240 in a non-trigger output state. The second trigger gating means 256 is maintained in a non-trigger output state by the non-trigger output of the primary trigger latching means 240. The third trigger gating means 272 is similarly held in a non-trigger output state by the nontrigger output of the second trigger gating means 256. At this time, the inverted first delayed trigger source signal 248 has no effect on the first trigger signal 206; the inverted second delayed trigger source signal 264 has no effect on the second trigger signal 210; and the inverted third delayed trigger source signal 280 has no effect on the third trigger signal 214.

At a time after the holdoff period, when the primary trigger latching means 240 has responded to the coincidence of the enabling state of the arm signal 238 and the selected trigger source event in the first delayed trigger source signal 248, the first delayed trigger source signal 248 is "cut off" at the trigger source signal gating means 242. Termination of the first delayed trigger source signal 248 serves to stabilize the primary trigger latching means 240 in a triggering output state for as long as an enabling state of the arm signal 238 is presented to the first trigger gating means 244. The stream of trigger source events entering the first trigger source signal delay path 254 ceases, and the last trigger source event to enter the first trigger source signal delay path 254 is the selected trigger source signal event associated with the latching of the primary trigger latching means 240. A constant signal follows this terminal trigger source signal event in the first trigger source signal delay path 254 and the second trigger source signal delay path 270.

Presentation of an enabling signal before a trigger source event (early holdoff) insures that the trigger output signal is generated as a result of the advent of the trigger source signal event rather than the intervening enabling signal. To achieve this, delivery of the terminal trigger source event to a given trigger gate is delayed, thereby allowing the previous trigger gate to present a stable trigger or enabling signal to the given trigger gate before the arrival of the terminal trigger event at the given trigger gate. For example, if the arm latch 232 is metastable for a sufficient period of time, i.e., the enabling state of the arm signal 238 arrives at the first trigger gating means 244 before the signal from the trigger source signal gating means 242, then trigger jitter would occur at the output of the first trigger gating means 244. But the trigger source event that caused the primary trigger latching means 240 to latch will propagate through the first trigger source signal delay path 254 and arrive at the second trigger gating means 256 with an excess of two gate delays with respect to the signal that would arrive from the the first trigger gating means 244 if the output of the first trigger gating means 244 were generated by the selected trigger source signal event rather than the enabling arm signal 238. Thus, the arm signal 238 can be metastable for an additional two gate delays before jitter will occur at the output of the second trigger gating means 256. The second trigger signal 210 provides a trigger signal having less jitter than the first trigger signal 206. Similarly, the third trigger signal 214 has less probability of jitter than the second trigger signal 210.

FIG. 3 is a circuit diagram of a single resynchronization stage presented to illustrate the method of cascading re-synchronization stages of this specific embodiment. Each re-synchronization stage has a source signal input terminal 300, an enabling signal input terminal 302, a trigger signal output terminal 304, an inverted trigger signal output terminal 306, and a delayed source signal output terminal 308. The source signal input terminal 300 accepts a first delayed trigger source signal 310, and the enabling signal input terminal 302 accepts a first inverted trigger signal 312. The trigger signal output terminal 304 provides a trigger signal 314, the inverted trigger signal output terminal 306 provides a second inverted trigger signal 316, and the delayed source signal output terminal 308 provides a second delayed trigger source signal 318.

The re-synchronization stage of FIG. 3 further includes a trigger source signal delay path 320 and a trigger gating means 322. The trigger source signal delay path 320 is comprised of serially linked single input NOR gates 324, 326, and 328. NOR gate 328 is the last NOR gate in the chain and has a non-inverted output and an inverted output. the trigger source signal delay path 320 receives the first delayed trigger source signal 310 from the source signal input terminal 300 at the input to NOR gate 324 and provide both an inverted second delayed trigger source signal 330 at the inverted output of NOR gate 328 and a second delayed trigger source signal 318 from the non-inverted output of NOR gate 328 at the delayed source signal output terminal 308. The trigger gating means 322 is an inverted input AND gate having a non-inverted output, an inverted output, a first inverted input which receives the inverted trigger signal 312 from the enabling signal input terminal 302, and a second inverted input which receives the inverted second delayed trigger source signal 330. The trigger gating means 322 provides at its non-inverted output the trigger signal 314 at the trigger signal output terminal 304 and also provides at its inverted output the second inverted trigger signal 316 at the inverted trigger signal output terminal 306. A first re-synchronization stage may be attached to the prior art trigger circuit 216 as has been portrayed in FIG. 2. Resynchronization stages beyond the first stage may be cascaded in the following manner: the source signal input terminal 300 is coupled to the delayed source signal output terminal 308 of the previous stage, and the enabling signal input terminal 302 is coupled to the inverted trigger signal output terminal 306 of the previous stage. At each stage the trigger signal output terminal 304 provides a trigger signal for that stage. The inverted trigger signal output terminal 306 and the delayed source signal output terminal 308 are not needed for the last re-synchronization stage; only the trigger signal 314 is taken from the last resynchronization stage.

Figure 4:
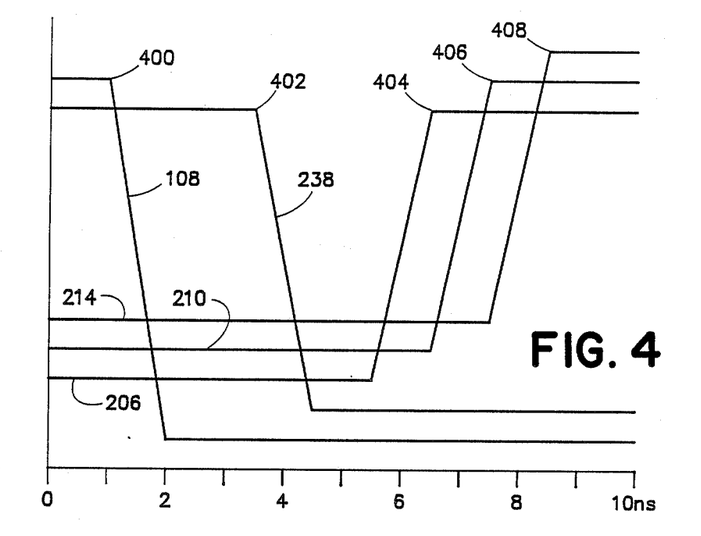
FIG. 4 is a timing diagram for the circuit of FIG. 2 depicting early holdoff.
Figure 5:
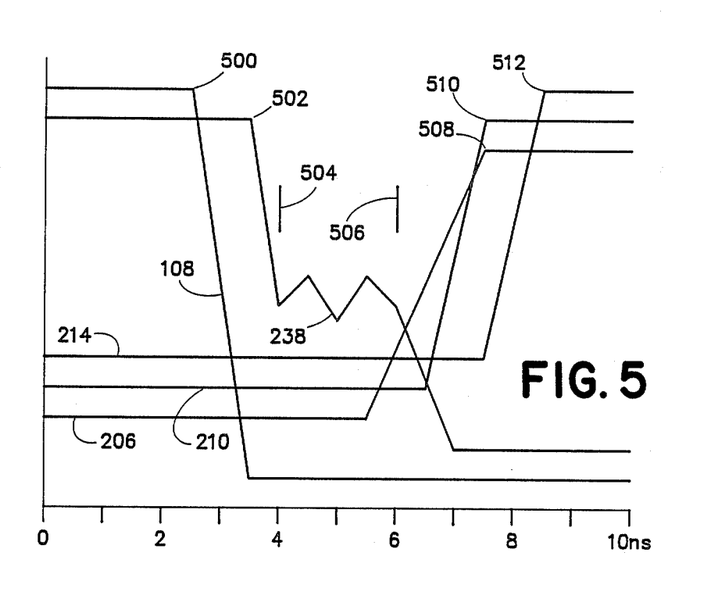
FIG. 5 is a timing diagram for the circuit of FIG. 2 depicting late holdoff.

FIG. 4 is a timing diagram for the circuit of FIG. 2 depicting simulation of early holdoff, i.e., presentation, at the input stage coincidence detector 228 (FIG. 2), of the enabling state of the holdoff signal well before presentation of the triggering event in the trigger source signal 110. FIG. 5 is a timing diagram for the circuit of FIG. 2 depicting simulation of late holdoff, i.e., presentation, at the input stage coincidence detector 228 (FIG. 2), of an enabling holdoff signal 110 during or at the end of a triggering event in the trigger source signal 110. Both FIG. 4 and FIG. 5 show the timing relationship between the holdoff signal 108, the arm signal 238, the first trigger signal 206, the second trigger signal 210, and the third trigger signal 214, assuming that the same trigger source event is selected in each case. FIG. 4 depicts the most common situation, early holdoff, producing ideal results for all three trigger signals 206, 210, and 214. FIG. 5 depicts the anomalous late holdoff situation where the first trigger signal 206 reaches the triggering state later than it ordinarily would, i.e., later than it would in an early holdoff situation. If the first trigger signal 206 of FIG. 5 were used to generate a display sweep, the resulting display would be an unstable or jittering display appearing horizontally displaced on the oscilloscope screen.

Referring to FIG. 4, the holdoff signal 108 begins to move toward an enabling state at the 1 ns time indicated at 400, and the arm signal 238 (which is a result of both holdoff enablement and a triggering event) moves toward an enabling state at a later, 3.5 ns, time indicated at 402. Because the enabling state of the holdoff signal was present well before the advent of a selected triggering event, the arm latching means 232 (FIG. 2) generates a clean transition in the arm signal 238. All three trigger signals 206, 210, and 214 similarly make clean transitions to their triggering states at approximately 6, 7, and 8 ns indicated at 404, 406, and 408, respectively.

Referring to FIG. 5, the holdoff signal 108 begins to move toward an enabling state at approximately 3 ns, indicated at 500, and the arm signal 238 similarly moves toward an enabling state at a short time later, i.e., at approximately 4 ns, indicated at 502. However, because the enabling state of the holdoff signal probably was presented during the selected triggering event, the arm latching means 232 (FIG. 2) is apt not to generate a clean transition in arm signal 238. The arm latching means 232 had just enough energy to responds but not enough energy to make a clean transition, and as a result, the arm signal 238 is metastable in a time interval, from approximately the 4 ns time indicated at vertical line 504 to the 6 ns time indicated at vertical line 506. Due to the metastability of the arm latch means 232 (FIG. 2), the first trigger signal 206 is therefore late, arriving at a triggering state at approximately 7 ns, indicated at 508, rather than the earlier, more typical, time of approximately 6 ns. Note, however, that the second trigger signal 210 and third trigger signal 214 are unaffected by the metastability of the arm latching means 232 (FIG. 2) and accordingly bear a consistent timing relationship to the selected trigger source event as when compared to transitions shown in FIG. 4. Specifically, the second trigger signal 210 arrives at its triggering state at approximately 7 ns indicated at 510 and the third trigger signal 214 arrives at its triggering state at approximately 8 ns indicated at 512.

FIG. 6 illustrates an alternative embodiment of the present invention which may be used when it is desirable to cascade a plurality of the resynchronization stages; in this embodiment a WIRED OR function is used to reduce the number of gates needed, the power consumed, and total propagation time. FIG. 6 includes a primary trigger latching means 600, a first resynchronization stage 602, a second re-synchronization stage 604, a common trigger gating means 606, and a WIRED OR node 608. The primary trigger latching means 600 performs the same function as the primary latching means 240 (FIG. 2) in providing an inverted first trigger signal 610 and a first delayed trigger source signal 612. The first re-synchronization stage 602 includes serially linked single input NOR gates 614, 616, and 618. The first delayed trigger source signal 612 is received at the input to NOR gate 614. NOR gate 618 is the last NOR gate in the chain having a non-inverted output and an inverted output, providing an inverted second delayed trigger source signal 620 at its inverted output and a second delayed trigger source signal 622 at its non-inverted output. The second re-synchronization stage 604 includes a NOR gate 624 serially linked with an OR gate 626. The second delayed trigger source signal 622 is coupled to the input or NOR gate 624, and OR gate 626 provides an inverted third delayed trigger source signal 628. The common trigger gating means 606 is an inverted input AND gate having a first inverted input coupled to receive the inverted third delayed trigger source signal 628 and a second inverted input coupled to the WIRED OR node 608. The common trigger gating means 606 provides at its non-inverted output a trigger signal 630. The WIRED OR node 608 is coupled to receive the inverted second delayed trigger source signal 620 as well as the inverted first trigger signal 610.

The basic differences between the trigger circuit of FIG. 6 and the trigger circuit of FIG. 2 are that in the trigger circuit of FIG. 6, the resynchronization stages share a common trigger gating means 606, the source signal delay paths of re-synchronization stages beyond the first resynchronization stage have one less gate, with the exception of the last re-synchronization stage each source signal delay path provides an inverted trigger source signal to the common WIRED OR node 608, and that the final gate in the last trigger source signal delay path is an OR gate rather than a NOR gate. Node 608 performs substantially the same function as gate 254 in FIG. 2.

The trigger circuit of FIG. 6 operates in the following manner. The common trigger gating means 606 provides the operative circuit output, trigger signal 630. The common trigger gating means 606 is armed by the output or state of the WIRED OR node 608 and triggered by the third delayed trigger source signal 628. Arming of the common trigger gating means 606 occurs after all inputs to the WIRED OR node 608 have presented an enabling condition; in this case the inputs to the WIRED OR node 608 are in an enabling condition in the low voltage state. Inputs to the WIRED OR node 608 include the inverted first trigger signal 610 and the inverted second delayed trigger source signal 620. The inverted first trigger signal 610 presents an enabling condition to the WIRED OR node 608 when the primary trigger latching means 600 changes to a triggering state; the inverted second delayed trigger source signal 620 presents an enabling condition to the WIRED OR node 608 after the selected trigger source event has passed from the first re-synchronization stage 602. After the common trigger gating means 606 is thus armed, it is triggered by presentation of the selected trigger source event in the form of the third delayed trigger source signal 628.

It should be understood that additional stages may be added to this embodiment. Each stage would comprise two single input serially linked NOR gates inserted in series between re-synchronization stages. To add one additional stage to the circuit of FIG. 6, the first NOR gate thereof would receive the second delayed trigger source signal 622. The second NOR gate thereof would provide a non-inverted further delayed trigger source signal at its non-inverted output to re-synchronization stage 604 and also provide an inverted further delayed trigger source signal to common WIRED OR node 608. Further stages may be added in like manner.

It should be understood that alternative configurations are possible that use the same basic concept, that is, to provide the arm and trigger latches more time to settle out by delaying the the trigger signal and re-synchronizing. One such alternative employs additional latches or flipflops that are enabled by a trigger signal of the previous stage and set or clocked by the delayed source signal. However, most of these configurations involve more complexity, power consumption, and propagation delay.

A cascadable trigger re-synchronization circuit has been disclosed which may be used in an oscilloscope horizontal display system. Many modifications and variations are possible in light of the above teachings; the appended claims are intended to cover and embrace any such modifications which fall within the true spirit and scope of the invention.

I claim:

1. In combination with a trigger signal generating circuit having a first trigger gating means coupled and responsive to a trigger source signal and holdoff signal, said first trigger gating means providing a first trigger signal, a trigger re-synchronization circuit comprising:
   a first trigger source signal delay means having an input and an output, said input being coupled to receive said trigger source signal and said output providing a first delayed trigger source signal; and
   a second trigger gating means coupled and responsive to said first trigger signal and said first delayed trigger source signal, said second trigger gating means providing at its output a second trigger signal having less jitter than the output of the first trigger gating means.

2. The combination according to claim 1, wherein said first trigger source signal delay means is comprised of a plurality of serially linked logic gates.

3. The combination according to claim 1, wherein said second trigger gating means is comprised of a coincidence detector responsive to the coincidence of a triggering state of said first delayed trigger source signal and the triggering state of said first trigger signal.

4. In combination with a trigger signal generating circuit having a first trigger gating means coupled and responsive to a trigger source signal and a holdoff signal, said first trigger gating means providing a first trigger signal, the combination comprising:
   a trigger re-synchronization circuit comprising a first trigger source signal delay means having an input and an output, said input being coupled to receive said trigger source signal and said output providing a first delayed trigger source signal, and a second trigger gating means coupled and responsive to said first trigger signal and said first delayed trigger source signal, said second trigger gating means providing at its output a second trigger signal having less jitter than the output of the first trigger gating means; and
   a plurality of additional trigger re-synchronization circuits cascaded upon said trigger re-synchronization circuit, each circuit of said plurality of additional trigger re-synchronization circuits having a trigger source signal delay means and a trigger gating means.

5. A trigger signal generating circuit comprising:
   a trigger source signal gating means for providing a first delayed trigger source signal;
   a first trigger gating means responsive to the first delayed trigger source signal and a holdoff signal, said first trigger gating means providing a first trigger signal;
   said trigger source signal gating means being responsive to said first trigger signal;
   a first trigger source signal delay means having an input and an output, said input being coupled to receive said first delayed trigger source signal and said output providing a second delayed trigger source signal; and
   a second trigger gating means coupled and responsive to said first trigger signal and said second delayed trigger source signal, said second trigger gating means providing a second trigger signal.

6. The trigger signal generating circuit according to claim 5, wherein said first trigger gating means is connected in feedback relation to said trigger source signal gating means to provide a bistable circuit.

7. The trigger signal generating circuit according to claim 5, wherein said first trigger gating means is comprised of a coincidence detector responsive to the coincidence of a triggering state of said first delayed trigger source signal and the enabling state of said holdoff signal.

8. The trigger signal generating circuit according to claim 5, wherein said trigger source signal gating means is comprised of a NOR gate having a non-inverted output coupled to the input of said first trigger source signal delay means and an inverted output coupled to said first trigger gating means.

9. The trigger signal generating circuit according to claim 5, wherein said first trigger source signal delay means is comprised of a plurality of serially linked logic gates.

10. The trigger signal generating circuit according to claim 5, wherein said second trigger gating means is comprised of a coincidence detector responsive to the coincidence of a triggering state of said second delayed trigger source signal and the triggering state of said first trigger signal from said first trigger signal gating means.

11. A trigger signal generating circuit comprising:
   a trigger re-synchronization circuit comprising a trigger source signal gating means for providing a first delayed trigger source signal, a firsttrigger gating means responsive to the first delayed trigger source signal and a holdoff signal, said first trigger gating means providing a first trigger signal, said trigger source signal gating means being responsive to said first trigger signal, a first trigger source signal delay means having an input and an output, said input being coupled to receive said first delayed trigger source signal and said output providing a second delayed trigger source signal, and a second trigger gating means coupled and responsive to said first trigger signal and said second delayed trigger source signal, said second trigger gating means providing a second trigger signal;
   a second trigger source signal delay means having an input and an output, said input being coupled to receive said second delayed trigger source signal and said output providing a third delayed trigger source signal; and a third trigger gating means coupled and responsive to said second trigger signal and said third delayed trigger source signal, said third trigger gating means providing a third trigger signal.

12. The trigger signal generating circuit according to claim 11, wherein said second trigger source signal delay means is comprised of a plurality of serially linked logic gates.

13. The trigger signal generating circuit according to claim 11, wherein said third trigger gating means is comprised of a coincidence detector responsive to the coincidence of a triggering state of said third delayed trigger source signal and the triggering state of said second trigger signal.

14. A trigger signal generating circuit comprising:

a trigger re-synchronization circuit comprising a trigger source signal gating means for providing a first delayed trigger source signal, a first trigger gating means responsive to the first delayed trigger source signal and a holdoff signal, said first trigger gating means providing a first trigger signal, said trigger source signal gating means being responsive to said first trigger signal, a first trigger source signal delay means having an input and an output, said input being coupled to receive said first delayed trigger source signal and said output providing a second delayed trigger source signal, and a second trigger gating means coupled and responsive to said first trigger signal and said second delayed trigger source signal, said second trigger gating means providing a second trigger signal; and a plurality of additional re-synchronization circuits cascaded upon said trigger re-synchronization circuit, each circuit of said plurality of additional re-synchronization circuits having a trigger source signal delay means and a trigger gating means.

15. The trigger signal generating circuit according to claim 14, wherein each trigger signal delay means of each circuit of said plurality of additional resynchronization circuits is comprised of a plurality of serially linked logic gates.

16. The trigger signal generating circuit according to claim 14, wherein each trigger gating means of each circuit of said plurality of additional resynchronization circuits is comprised of a coincidence detector.

17. A method for generating a trigger signal having reduced jitter, which comprises the steps of:

generating a first trigger signal utilizing a first delayed trigger source signal in combination with a holdoff signal;

delaying said first delayed trigger source signal to provide a second delayed trigger source signal; and generating a second trigger signal utilizing said first trigger signal in combination with said second delayed trigger source signal, said second trigger signal having less jitter than said first trigger signal.

18. The method for generating a trigger signal according to claim 17, wherein a single triggering state of said trigger source signal is utilized to generate both the first trigger signal and the second trigger signal.

19. The method for generating a trigger signal according to claim 17, wherein said second trigger signal is generated in response to the coincidence of a triggering state of said second delayed trigger source signal and an enabling state of said first trigger signal.

20. A method for generating a trigger signal having reduced jitter, which comprises the steps of:

generating a first trigger signal utilizing a first delayed trigger source signal in combination with a holdoff signal;

delaying said first delayed trigger source signal to provide a second delayed trigger source signal;

generating a second trigger signal utilizing said first trigger signal in combination with said second delayed trigger source signal, said second trigger signal having less jitter than said first trigger signal;

delaying said second delayed trigger source signal to provide a third delayed trigger source signal; and generating a third trigger signal utilizing said second trigger signal in combination with said third delayed trigger source signal, said third trigger signal having less jitter than said second trigger signal.

21. The method for generating a trigger signal according to claim 20, wherein a single triggering state is utilized to generate the first trigger signal, the second trigger signal, and the third trigger signal.

22. The method for generating a trigger signal according to claim 20, wherein said third trigger signal is generated in response to the coincidence of a triggering state of said third delayed trigger source signal and an enabling state of said second trigger signal.

23. Holdoff circuit means for the trigger circuit of a cathode ray oscilloscope utilized to prevent triggering of said oscilloscope until after its sweep circuit has recovered from a given sweep, said holdoff circuit including:

means for receiving a trigger signal and responsive to a holdoff signal in combination with the trigger signal for generating a trigger gate, second means receiving said trigger gate and responsive to said trigger gate in combination with said trigger signal in delayed form for generating a second trigger gate, and means for applying said second trigger gate for triggering said cathode ray oscilloscope.

24. A re-synchronization circuit for generating a trigger signal having reduced jitter comprising:

a first trigger signal generating means for generating a first trigger signal utilizing a first delayed trigger source signal in combination with a holdoff signal;

a first trigger source signal delay means for delaying said first delayed trigger source signal to provide a second delayed trigger source signal; and a second trigger signal generating means for generating a second trigger signal utilizing said first trigger signal in combination with said second delayed trigger source signal, said second trigger signal having less jitter than said first trigger signal.

25. The re-synchronization circuit according to claim 24, wherein said first trigger signal generating means includes:

an input stage trigger source signal delay means having an input receiving a trigger source signal and providing an output representing said trigger source signal in delayed form;

an input stage coincidence detector coupled to receive said trigger source signal and said holdoff signal, said input stage coincidence detector being responsive to the coincidence of an enabling state of said holdoff signal and a triggering state of said trigger source signal;

an arm latching means acting as a bistable circuit responsive to the coincidence detector output and providing an arm signal; and a primary trigger latching means acting as a bistable circuit responsive to an enabling state of said arm signal and a triggering state of the trigger source signal as received from the input stage trigger source signal delay means.

26. The re-synchronization circuit according to claim 24, wherein said first trigger source signal delay means is comprised of a plurality of serially linked logic gates.

27. The re-synchronization circuit according to claim 24, wherein said second trigger signal generating means is comprised of a coincidence detector responsive to a triggering state of said second delayed trigger source signal and the triggering state of said first trigger signal.

28. The re-synchronization circuit according to claim 24, wherein the time delay of said first trigger source signal delay means is less than the period of the highest triggering frequency to be utilized in said re-synchronization circuit.

29. A re-synchronization circuit for generating a trigger signal having reduced jitter comprising:

a first trigger signal generating means for generating a first trigger signal utilizing a first delayed trigger source signal in combination with a holdoff signal;

said first trigger signal generating means comprising an input stage trigger source signal delay means having an input receiving a trigger source signal and providing an output representing said trigger source signal in delayed form, an input stage coincidence detector coupled to receive said trigger source signal and said holdoff signal, said input stage coincidence detector being responsive to the coincidence of an enabling state of said holdoff signal and a triggering state of said trigger source signal, an arm latching means acting as a bistable circuit responsive to the coincidence detector output and providing an arm signal, and a primary trigger latching means acting as a bistable circuit responsive to an enabling state of said arm signal and a triggering state of the trigger source signal as received from the input stage trigger source signal delay means;

a first trigger source signal delay means for delaying said first delayed trigger source signal to provide a second delayed trigger source signal;

a second trigger signal generating means for generating a second trigger signal utilizing said first trigger signal in combination with said second delayed trigger source signal, said second trigger signal having less jitter than said first trigger signal;

a second trigger source signal delay means for delaying said second delayed trigger source signal to provide a third delayed trigger source signal; and a third trigger signal generating means for generating a third trigger signal utilizing said second trigger signal in combination with said third delayed trigger source signal, said third trigger signal having less jitter than said second trigger signal.

30. The re-synchronization circuit according to claim 29, wherein said second trigger source signal delay means is comprised of a plurality of serially linked logic gates.

31. The re-synchronization circuit according to claim 29, wherein said third trigger signal generating means is comprised of a coincidence detector responsive to a triggering state of said third delayed trigger source signal and the triggering state of said second trigger signal.

32. The re-synchronization circuit according to claim 29, wherein the time delay of said second trigger source signal delay means is less than the period of the highest triggering frequency to be utilized in said re-synchronization circuit.

33. A trigger signal generating circuit comprising:

a first trigger signal generation means for generating a first trigger signal utilizing a first delayed trigger source signal in combination with a holdoff signal;

a plurality of trigger source signal delay means, each of said plurality of trigger source signal delay means having an input and an output, said plurality of trigger source signal delay means being connected in series with inputs connected to outputs;

a final trigger source signal delay means having an input and an output, the input of said final trigger source signal delay means being coupled to the output of one of said plurality of trigger source signal delay means and the output of said final trigger source signal delay means providing a final delayed trigger source signal;

an OR logic means coupled to receive said first trigger signal and the output of said one of said plurality of trigger source signal delay means; and a common trigger gating means coupled to receive said final delayed trigger source signal and the output of said OR logic means.

34. The trigger signal generating circuit according to claim 33, wherein each of said plurality of trigger source signal delay means comprises a plurality of serially linked logic gates.

35. The trigger signal generating circuit according to claim 33, wherein the time delay of each of said plurality of trigger source signal delay means is less than the period of the highest triggering frequency to be utilized on said trigger signal generating circuit.

36. The trigger signal generating circuit according to claim 33, wherein said OR logic means is comprised of combinational logic gates.

37. The trigger signal generating circuit according to claim 33, wherein said OR logic means is comprised of a WIRED OR node.

* * * * *